United States Patent
Cutting et al.

(10) Patent No.: US 6,519,845 B1
(45) Date of Patent: Feb. 18, 2003

(54) WIRE BONDING TO DUAL METAL COVERED PAD SURFACES

(75) Inventors: Lawrence Richard Cutting, Owego, NY (US); John Gerard Gaudiello, Apalachin, NY (US); Luis Jesus Matienzo, Endicott, NY (US); Nikhil Mohan Murdeshwar, Apalachin, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/481,478

(22) Filed: Jan. 11, 2000

Related U.S. Application Data

(62) Division of application No. 09/017,338, filed on Feb. 2, 1998.

(51) Int. Cl.[7] .................................................. H01R 9/00
(52) U.S. Cl. ..................... 29/843; 842/844; 228/180.5
(58) Field of Search ........................ 29/825, 842, 843, 29/844, 832; 228/180.5

(56) References Cited

U.S. PATENT DOCUMENTS

| | | |
|---|---|---|
| 5,100,835 A | 3/1992 | Zheng |
| 5,618,754 A | 4/1997 | Kasahara ..................... 438/653 |

FOREIGN PATENT DOCUMENTS

| | | | |
|---|---|---|---|
| JP | 63318134 A | | 12/1988 |
| JP | 01-144641 | * | 6/1989 |

OTHER PUBLICATIONS

Dreyer et al,27[th] Electronic Components Conference p 421–8 1977i, published by IEEE.*

* cited by examiner

*Primary Examiner*—Carl J. Arbes
(74) *Attorney, Agent, or Firm*—John R. Pivnichny

(57) ABSTRACT

Wire bonds are made to palladium coated bonded lads on organic dielectric substrates at temperatures below 200° C. A layer of palladium thicker than 14 micro-inches is covered with a thin flash of gold. Palladium coated over copper pads is protected from copper diffusion by a thin nickel layer positioned between the two. Subsequent baking for 1 hour at 185° C. drives off hydrogen molecules provided the gold is less than 200 Å thick. A bonding wire, preferably of gold is then successfully bonded to the pad using conventional bonding equipment at temperatures below 200° C.

13 Claims, 2 Drawing Sheets

WIRE BONDING TO DUAL METAL COVERED PAD SURFACES

This is a division of application Ser. No. 09/017,338, filed Feb. 2, 1998.

TECHNICAL FIELD

The invention relates to wire bonding to bond pads on semiconductor chip packages and in particular to bond pads which have been coated with palladium.

BACKGROUND OF THE INVENTION

The art of making an electrical connection to a semiconductor chip by wire bonding from a bonding pad on the chip to a corresponding pad or lead on a chip carrier is widely known and practiced in the semiconductor industry. While it has been found to be advantageous in some applications to manufacture chip carriers using conventional organic dielectric material such as epoxy-glass layers and conductive layers of copper, wire bonds made to a copper pad typically fail due to formations of a brittle intermetallic alloy which forms between the wire material, usually gold and the copper pad. Accordingly, one typical practice in the art is to plate a bond pad with a thin layer of nickel followed by a thicker layer of gold prior to bonding a gold wire thereto.

A nickel layer of about 150±50 micro-inch thickness provides a satisfactory diffusion barrier to prevent the formation of copper-gold intermetallic alloys between the copper pad and the gold layer. The gold layer then provides a satisfactory surface for making conventional wire bond connections. A fairly thick layer of gold, typically greater than fourteen micro-inches is needed for satisfactory bonds with gold wire of 0.8 to 1.5 mili-inch diameter.

Palladium has been used as a lower cost substitute for the gold layer; however, it has been found that the palladium must be heated to relatively high temperatures, e.g., above 200° C., in order to make satisfactory bonds. Because epoxy-glass materials do not tolerate such high temperatures, various attempts have been made to make wire bonds to palladium coated pads, with a nickel diffusion barrier beneath the palladium, without success.

Gillum et al., in "Wire Bond Evaluation Report" by National Center for Manufacturing Sciences, Apr. 30, 1996, reports on p.13 that palladium surfaces give poor results, with many initial incomplete bonds being formed.

SMT Trends, Jan. 22, 1996 reported satisfactory bonds in a preliminary study "Electroless Palladium: A Surface Finish for Interconnect Technology"; however, the bonding temperature used was not reported.

It has been suggested in Japanese patent JP-8139148A that the bondability of a palladium layer over copper can be determined prior to bonding, by measuring how much copper has diffused up through the palladium layer. When a nickel barrier layer is placed under the palladium, bonds made at temperatures below 200° C. fail.

Consequently, palladium has not been used to coat wire bond pads on organic dielectric chip carriers even though palladium has been found to be a satisfactory substitute for gold in coating pads which are used for mounting components by soldering. Where both wire bond chips and soldered components are to be mounted on a single carrier, the use of palladium for both types of bonding pads would be advantageous over using separate metallurgies or the more costly use of gold for both pads, as is the current practice.

OBJECTS AND SUMMARY OF THE INVENTION

It is, therefore, an object of the invention to enhance the semiconductor chip packaging art by providing an enhanced method for bonding wiring to a metal surface on a package, chip, or any other conductive element in the art.

A further object of the invention is to provide an electrical card structure having enhanced bondable pads for receiving conductive wiring.

These and other objects are attained in one embodiment of the invention wherein there is provided a method of forming a bondable metal surface by providing a layer of a first metal, applying a thin layer of a second metal to the first metal layer, and heating the first and second metal layers to a predetermined temperature for a predetermined time. The method may also include the step of bonding a wire to the layer of first metal with the thin layer of second metal thereon.

In accordance with another embodiment of the invention, there is provided an electrical card structure comprising a circuitized substrate having at least one wire bond pad located thereon, a layer of a first metal located on the wire bond pad, and a thin layer of a second metal on the layer of first metal. The electrical card structure may also include a wire bonded to the layer of first metal with a thin layer of second metal located on the first metal, the bond occurring through the thin second layer.

BEST MODE FOR CARRYING OUT THE INVENTION

For a better understanding of the present invention, together with other and further objects, advantages and capabilities thereof, reference is made to the following disclosure and the appended claims in connection with the above-described drawings.

Figure 1:
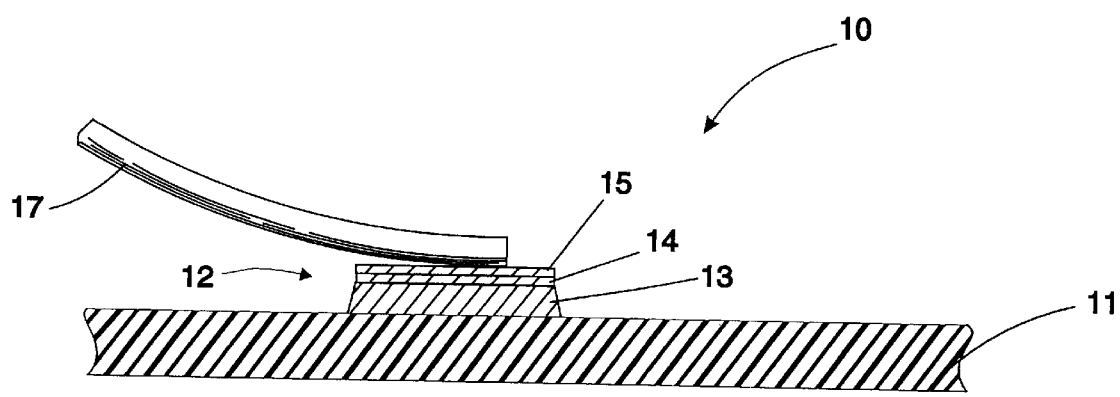
FIG. 1, illustrates a wire bond to a first metal, e.g., palladium, pad coated with a flash layer of a second metal, e.g., gold, in accordance with one embodiment of the invention.

In FIG. 1, there is shown an electrical card structure 10 in accordance with one embodiment of the invention. Electrical card structure 10 includes a circuitized substrate 11 made of a suitable dielectric material (preferably an organic insulator such as known epoxy-glass) with one or more metallic e.g., copper, wiring layers 13 (described below) thereon. At least one wire bond pad 12 on substrate 11 may be part of the wiring layer 13, or a separate electrical conductor. A layer of a first metal 14 on layer 13 is preferably formed from palladium and is preferably at least about 5 micro-inches thick. In embodiments having copper bond pads, it is preferable to have a thin layer of nickel (not shown) about 120–180 micro inches thick between the copper and palladium, for the reasons described in the background above.

A thin layer of a second metal 15, different from the first metal, is located on the layer of first metal 14. Preferably, layer 15 is gold between 50 Angstrom and 200 Angstrom in thickness. Significantly, such a very thin layer of gold has been proven to prevent oxidation of the metal layer below while not adding appreciably to the cost of the finished structure. The gold layer may be applied with an immersion process which is well known in the art.

A wire-bond wire 17 is attached by wire bonding techniques known in the art to the layer of first metal 14 through thin layer of second metal 15. Wire 17 is preferably a gold wire of 0.0008 to 0.00125 inch diameter, although other wire material such as aluminum or copper may be used.

Figure 2:
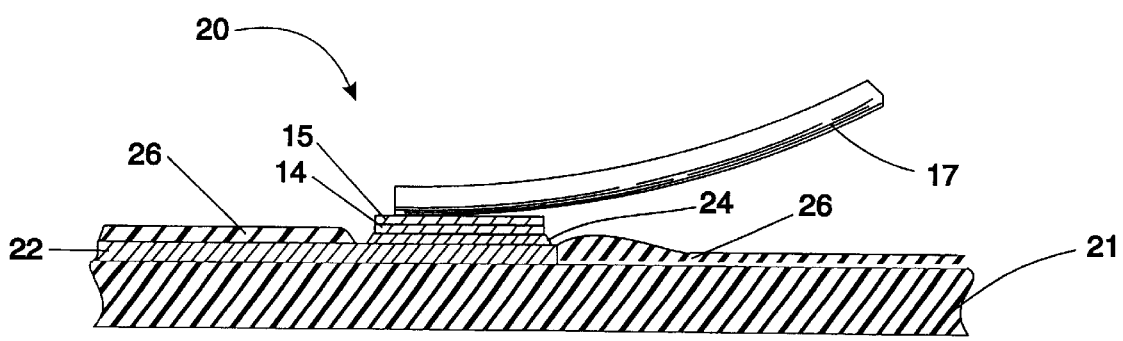
FIG. 2 shows another embodiment of the invention by illustrating bonding a wire to a pad with a barrier layer thereon, having a dual metal layer of first and second metals, as taught herein.

In FIG. 2, another embodiment 20 of the invention is shown wherein a base 21 supports a circuitized substrate 22. Base 21 may be a support member, stiffener, or heatsink, and substrate 22 may be a flexible film substrate made of MYLAR (MYLAR is a trademark of E.I. DuPont de Nemours, Inc.), polyimide, or thin epoxy-glass material, having one or more copper wiring layers as part thereof. Only a single layer is shown for substrate 22, which may simply comprise a layer of conductive material such as copper.

A layer of first metal 14 (preferably palladium) is positioned on circuitized substrate 22. An isolating layer 24 of nickel can be used to separate the first metal layer from substrate 22, especially if palladium and copper are used for these two elements. A thin layer of a second metal 15, (preferably gold) of about 50 Angstrom to 200 Angstrom thickness covers the top surface of first metal 14. A bonding wire 17 is attached to the first metal layer 14 through the thin layer of second metal 15. In this embodiment, a layer of protective coating material 26 of epoxy or other suitable insulating material covers substrate 22 and base 11 externally of the bond area.

Other structures having pads made as taught herein include semiconductor chips, discrete components, etc., to which it may be desirable to attach wire bonds using conventional techniques such as thermocompression, ultrasonic, or the like.

A preferred method for making the structures of FIGS. 1 and 2 is to first plate a barrier layer (e.g., 120–180 micro inches thick of nickel) to a copper bond pad using known electroless plating techniques. Then a layer of palladium of at least 5 micro inch thickness is electroless plated to the nickel layer. A thin layer of gold is then immersion (electroless) plated to the palladium. The gold layer prevents oxidation of the palladium surface which otherwise would not provide acceptable bonds at temperatures below 200° C. To minimize cost, the gold layer is made negligibly thin, but no less than about 50 Angstrom. Significantly, this gold layer is sufficiently thin to allow hydrogen molecule passage therethrough, these molecules originating from the palladium at elevated temperatures thereof during the processing defined below.

The palladium and gold layers are then heated in air to a temperature ≧185° C. for a period of about 1 hour. During this heating step, hydrogen molecules entrapped in the palladium layer are driven out by the heat and released to the atmosphere by passing through the gold layer. It has been determined that the gold layer must be less than about 200 Angstrom thick for the hydrogen molecules to satisfactorily pass through and be released. It is believed at the present time that hydrogen molecules trapped in the palladium are the cause of poor bonding to palladium surfaces at temperatures below 200° C. because hydrogen makes the plated palladium material surface harder. The present invention is known to release this hydrogen while preventing oxidation of the palladium surface during heating and prior to bonding a wire to the palladium through the gold. Furthermore, successful bonds using gold wire of 0.001 inch diameter have been made using the present invention without heating the palladium layer above 200° C.

The gold layer, while preventing oxidation of the palladium, is so thin that its presence plays no part in the wire bonding itself, being easily broken through. For example, a gold wire of 0.001 inch diameter can be bonded directly to the palladium layer, thorough the extremely thin gold. In contrast, a gold wire to thick gold pad bond would require a layer of gold on the pad of about 8 micro-inch thickness, equal to 2032 Angstrom (over 40 times more than that used for the present invention.)

While there have been shown and described what are at present considered the preferred embodiments of the invention, it will be obvious to those skilled in the art that various changes and modifications may be made therein without departing from the scope of the invention as defined by the appended claims.

What is claimed is:

1. A method of forming a bondable metal surface, comprising the steps of:
   providing a layer of a first metal;
   applying a thin layer of a second metal, different from said first metal, to said layer of first metal thereon; and
   heating said layer of a first metal with said thin layer of a second metal to a predetermined temperature for a predetermined time to thereby form a bondable metal surface on said thin layer of said second metal.

2. The method of claim 1 in which said layer of said first metal is palladium and is provided at a thickness of greater than about 5 micro-inches.

3. The method of claim 2 in which said thin layer of said second metal is applied by immersing said palladium in a gold bath until said thin layer is about 50 Angstrom to about 200 Angstrom in thickness.

4. The method of claim 3 in which said heating of said layer of first metal is provided at a temperature of about 185° C. for about one hour.

5. The method of claim 1 further comprising the step of providing a third metal and thereafter plating said layer of said first metal on said third metal.

6. The method of claim 5 in which said third metal is provided as a layer of nickel.

7. The method of claim 1 further including the step of bonding a wire to said layer of said first metal through said thin layer of said second metal.

8. The method of claim 7 in which said bonding is performed by bonding a gold wire of about 0.0008 to 0.00125 inch diameter.

9. The method of claim 7 in which said bonding is performed using wire bonding equipment.

10. The method of claim 1 in which said layer of said first metal is provided on a dielectric substrate.

11. The method of claim 10 further including the step of bonding a wire to said layer of said first metal through said thin layer of said second metal.

12. The method of claim 1 wherein said layer of a first metal is provided by electroless deposition of said first metal onto a circuitized substrate having an organic insulator.

13. The method of claim 12 wherein said organic insulator is epoxy-glass.

* * * * *